(12) United States Patent
Ok et al.

(10) Patent No.: US 10,937,861 B2
(45) Date of Patent: *Mar. 2, 2021

(54) SEMICONDUCTOR STRUCTURES INCLUDING MIDDLE-OF-LINE (MOL) CAPACITANCE REDUCTION FOR SELF-ALIGNED CONTACT IN GATE STACK

(71) Applicant: TESSERA, INC., San Jose, CA (US)

(72) Inventors: Injo Ok, Loudonville, NY (US); Balasubramanian Pranatharthiharan, Watervliet, NY (US); Soon-Cheon Seo, Glenmont, NY (US); Charan V. V. S. Surisetty, Clifton Park, NY (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/399,845

(22) Filed: Apr. 30, 2019

(65) Prior Publication Data

US 2019/0259831 A1 Aug. 22, 2019

Related U.S. Application Data

(60) Continuation of application No. 15/206,127, filed on Jul. 8, 2016, now Pat. No. 10,355,080, which is a
(Continued)

(51) Int. Cl.
*H01L 29/06* (2006.01)
*H01L 21/764* (2006.01)
(Continued)

(52) U.S. Cl.
CPC ...... *H01L 29/0649* (2013.01); *H01L 21/3065* (2013.01); *H01L 21/31053* (2013.01);
(Continued)

(58) Field of Classification Search
CPC .............. H01L 29/0649; H01L 23/485; H01L 21/76805; H01L 21/7682; H01L 21/76829;
(Continued)

(56) References Cited

U.S. PATENT DOCUMENTS 6,281,585 B1 8/2001 Bothra
6,362,073 B2 3/2002 Kim
(Continued)

OTHER PUBLICATIONS

List of IBM Patents or Patent Applications Treated as Related Form; OK, I., U.S. Appl. No. 14/951,333, filed Nov. 24, 2015 OK, I., U.S. Appl. No., 15/206,127, filed Jul. 8, 2016 OK, I., U.S. Appl. No. 16/399,845, filed Apr. 30, 2019.

*Primary Examiner* — Patricia D Reddington
(74) *Attorney, Agent, or Firm* — Lee & Hayes, P.C.

(57) ABSTRACT

A method of forming a semiconductor structure includes forming a first middle-of-line (MOL) oxide layer and a second MOL oxide layer in the semiconductor structure. The first MOL oxide layer including multiple gate stacks formed on a substrate, and each gate stack of the gate stacks including a source/drain junction. A first nitride layer is formed over a silicide in the first MOL oxide layer. A second nitride layer is formed. Trenches are formed through the second nitride layer down to the source/drain junctions. A nitride cap of the plurality of gate stacks is selectively recessed. At least one self-aligned contact area (CA) element is formed within the first nitride layer. The first MOL oxide layer is selectively recessed. An air-gap oxide layer is deposited. The air gap oxide layer is reduced to the at least one self-aligned CA element and the first nitride layer.

18 Claims, 15 Drawing Sheets

Related U.S. Application Data division of application No. 14/951,333, filed on Nov. 24, 2015, now Pat. No. 10,256,296.

(51) Int. Cl.

| | | |
|---|---|---|
| *H01L 21/762* | (2006.01) | |
| *H01L 21/3105* | (2006.01) | |
| *H01L 21/3213* | (2006.01) | |
| *H01L 21/3065* | (2006.01) | |
| *H01L 29/49* | (2006.01) | |
| *H01L 23/485* | (2006.01) | |
| *H01L 21/768* | (2006.01) | |
| *H01L 21/8234* | (2006.01) | |
| *H01L 23/532* | (2006.01) | |
| *H01L 23/535* | (2006.01) | |
| *H01L 27/088* | (2006.01) | |
| *H01L 29/161* | (2006.01) | |

(52) U.S. Cl.
CPC ...... *H01L 21/32139* (2013.01); *H01L 21/762* (2013.01); *H01L 21/764* (2013.01); *H01L 21/7682* (2013.01); *H01L 21/76805* (2013.01); *H01L 21/76829* (2013.01); *H01L 21/76889* (2013.01); *H01L 21/823475* (2013.01); *H01L 23/485* (2013.01); *H01L 23/535* (2013.01); *H01L 23/5329* (2013.01); *H01L 23/53266* (2013.01); *H01L 27/088* (2013.01); *H01L 29/4975* (2013.01); *H01L 21/31056* (2013.01); *H01L 21/76849* (2013.01); *H01L 21/76897* (2013.01); *H01L 29/161* (2013.01); *H01L 29/4991* (2013.01)

(58) Field of Classification Search
CPC ....... H01L 21/76889; H01L 21/823475; H01L 23/53266; H01L 23/5329; H01L 23/535; H01L 27/088; H01L 21/764; H01L 21/762; H01L 21/31053; H01L 21/32139; H01L 21/3065; H01L 29/4975; H01L 29/161; H01L 29/4991; H01L 21/76849; H01L 21/31056; H01L 21/76897

See application file for complete search history.

(56) References Cited

U.S. PATENT DOCUMENTS

| | | |
|---|---|---|
| 7,138,329 B2 | 11/2006 | Lur et al. |
| 8,232,618 B2 | 7/2012 | Breyta |
| 8,637,384 B2 | 1/2014 | Ando et al. |
| 8,637,930 B2 | 1/2014 | Ando et al. |
| 8,803,248 B2 | 8/2014 | Park et al. |
| 8,841,711 B1 | 9/2014 | Cai |
| 8,847,401 B2 | 9/2014 | Chen et al. |
| 8,872,304 B2 | 10/2014 | Oshida |
| 8,912,591 B2 | 12/2014 | Baek et al. |
| 8,946,048 B2 | 1/2015 | Purayath et al. |
| 9,076,816 B2 | 7/2015 | Zhang et al. |
| 9,153,498 B2 | 10/2015 | Xie et al. |
| 9,443,761 B2 | 9/2016 | Shao |
| 9,559,175 B2 | 1/2017 | Usami et al. |
| 2001/0036723 A1 | 11/2001 | Torres |
| 2012/0104471 A1 | 5/2012 | Chang |
| 2012/0104512 A1 | 5/2012 | Horak |
| 2013/0049132 A1 | 2/2013 | Doris |
| 2013/0207269 A1 | 8/2013 | Oshida |
| 2014/0035147 A1 | 2/2014 | Lee |
| 2014/0353728 A1 | 12/2014 | Derderian et al. |
| 2015/0162277 A1 | 6/2015 | Zhang et al. |
| 2015/0162278 A1 | 6/2015 | Zhang et al. |
| 2015/0270176 A1 | 9/2015 | Xie |
| 2015/0364378 A1* | 12/2015 | Xie .................. H01L 21/76897 257/368 |

* cited by examiner

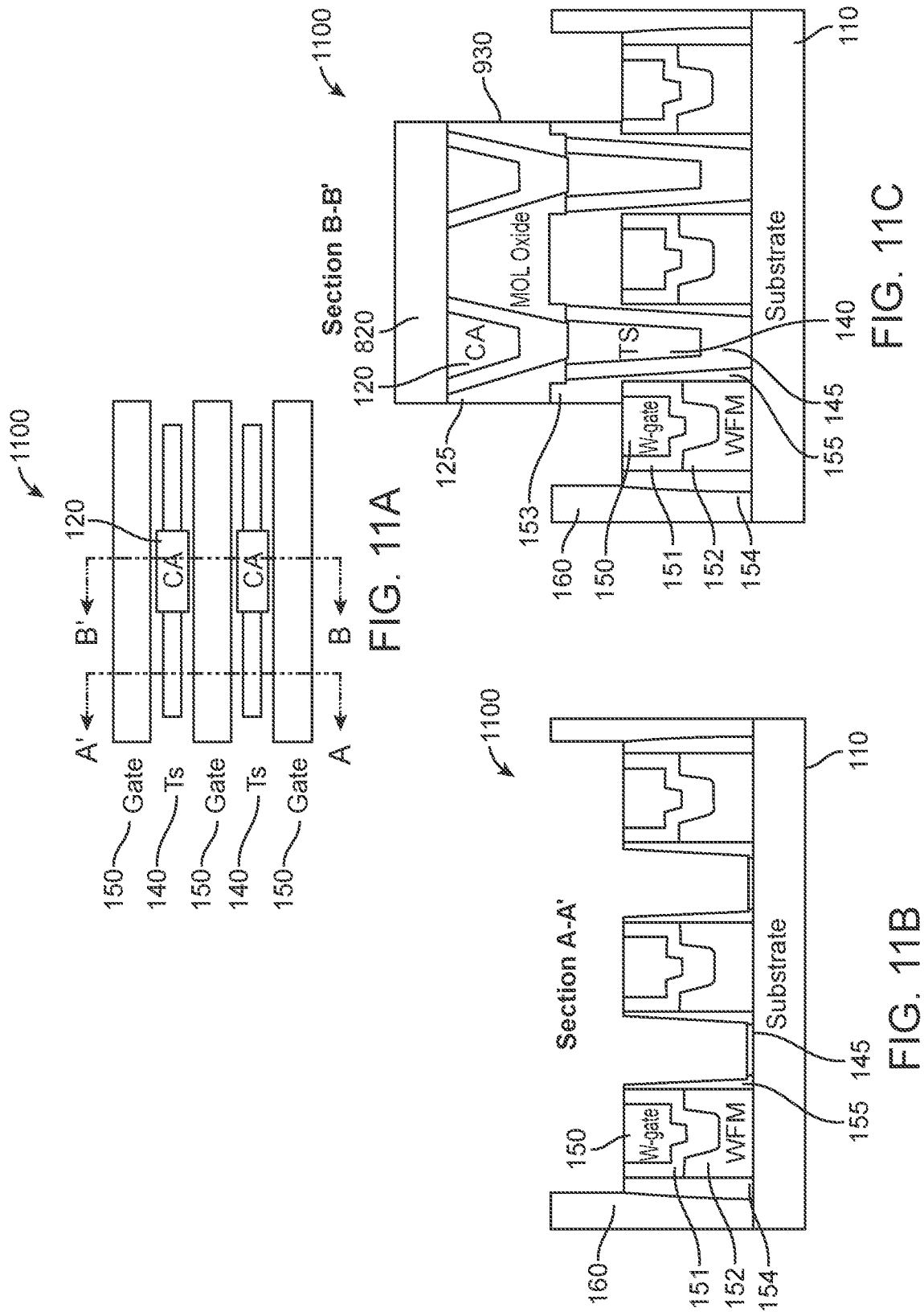

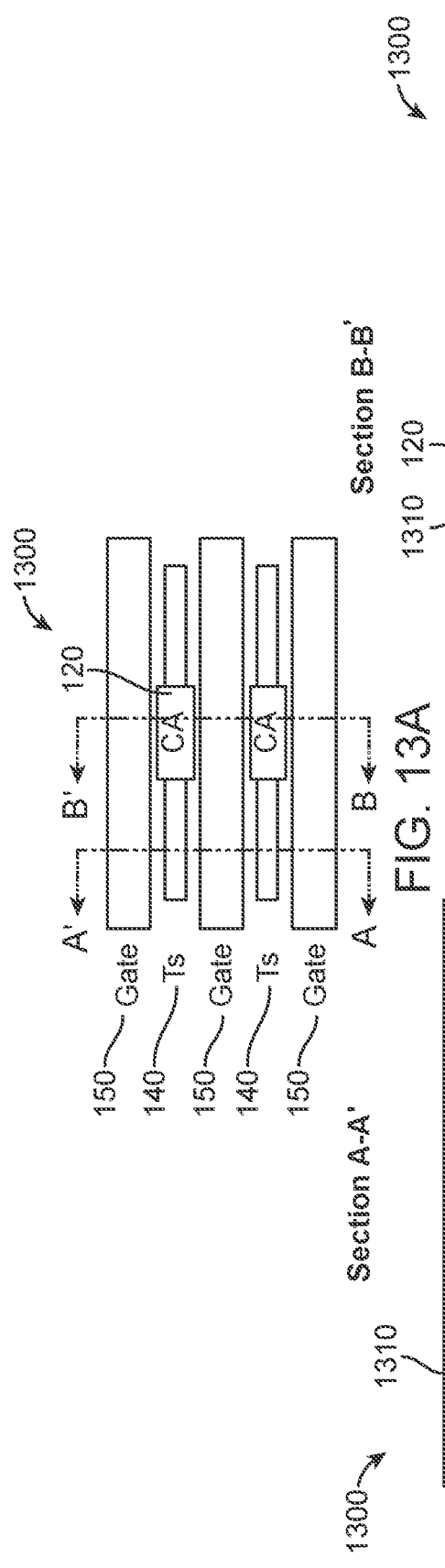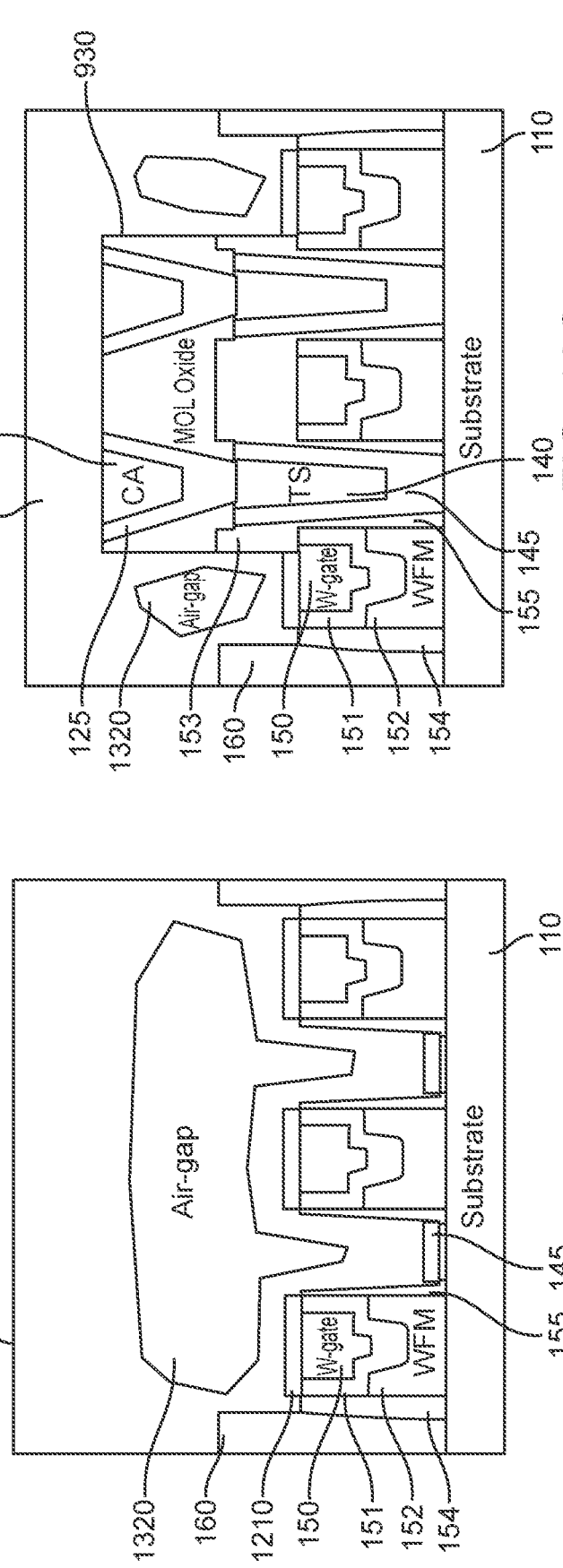

US 10,937,861 B2

SEMICONDUCTOR STRUCTURES INCLUDING MIDDLE-OF-LINE (MOL) CAPACITANCE REDUCTION FOR SELF-ALIGNED CONTACT IN GATE STACK

BACKGROUND

Nitride stacks are formed by opening contact holes in nitride and oxide layers covering one or more semiconductor devices on a silicon wafer. In a conventional MOL process, the nitride layer is formed to a thickness (e.g., 40 nanometers (nm)) and a thinner oxide layer is formed over the nitride layer (e.g., 10 nm). The oxide and nitride layers are then patterned to open contact holes down to the source/drain regions (also referred to as "active regions") of the semiconductor devices. In order to reduce the capacitance associated with the post gate (PG) nitride, a thinner nitride layer may be desirable. However, utilizing a thinner nitride layer in a conventional process flow is not feasible because gouging by a chemical mechanical planarization (CMP) process step may cause the semiconductor devices to be susceptible to short circuit failures.

SUMMARY

One or more embodiments relate to semiconductor devices including middle-of-line (MOL) capacitance reduction with integration for self-aligned contact. In one embodiment, a method of forming a semiconductor structure includes forming a first middle-of-line (MOL) oxide layer and a second MOL oxide layer in the semiconductor structure. The first MOL oxide layer including a plurality of gate stacks formed on a substrate, and each gate stack of the plurality of gate stacks including a source/drain junction. A first nitride layer is formed over a silicide in the first MOL oxide layer. A second nitride layer is formed. Trenches are formed through the second nitride layer down to the source/drain junctions. A nitride cap of the plurality of gate stacks are selectively recessed. At least one self-aligned contact area (CA) element is formed within the first nitride layer. The first MOL oxide layer is selectively recessed on a first side and a second side of the at least one self-aligned CA element leaving remaining portions of the first MOL oxide layer on top portions of the first nitride layer, portions of the silicide and portions of the nitride cap. An air-gap oxide layer is deposited introducing one or more air-gaps in the deposited air-gap oxide layer. The air gap oxide layer is reduced to the at least one self-aligned CA element and the first nitride layer. A portion of the air-gap oxide layer replaces a removed portion of the first_MOL oxide layer.

These and other features, aspects and advantages of the present embodiments will become understood with reference to the following description, appended claims and accompanying figures.

BRIEF DESCRIPTION OF THE DRAWINGS

FIG. 11A is a top-down view of the exemplary semiconductor device structure of FIG. 10A and shown after etching of the nitride cap, according to an embodiment;

FIG. 11B is a cross-sectional view of the semiconductor device in FIG. 11A along section line A-A';

FIG. 11C is a cross-sectional view of the semiconductor device in FIG. 11A along section line B-B';

FIG. 13A is a top-down view of the exemplary semiconductor device structure of FIG. 12A and shown after removing the CA mask and oxide fill forming air-gaps, according to an embodiment;

FIG. 13B is a cross-sectional view of the semiconductor device in FIG. 13A along section line A-A';

FIG. 13C is a cross-sectional view of the semiconductor device in FIG. 13A along section line B-B';

DETAILED DESCRIPTION

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

As used herein, a "lengthwise" element is an element that extends along a corresponding lengthwise direction, and a "widthwise" element is an element that extends along a corresponding widthwise direction.

One or more embodiments provide for an integration of semiconductor layers to minimize middle-of-line (MOL) capacitance by introducing air gaps within semiconductor structures. In one or more embodiments, the air gaps are introduced into voids formed in the semiconductor structures. In one embodiment, the formation of the voids are controlled due to the shape of the semiconductor structures. In one or more embodiments, the introduction of air-gaps into the semiconductor structures reduces the capacitance of a MOL oxide layer due to remaining MOL oxide layer reduction, introduced air-gaps and an air-gap oxide layer.

Figure 1:
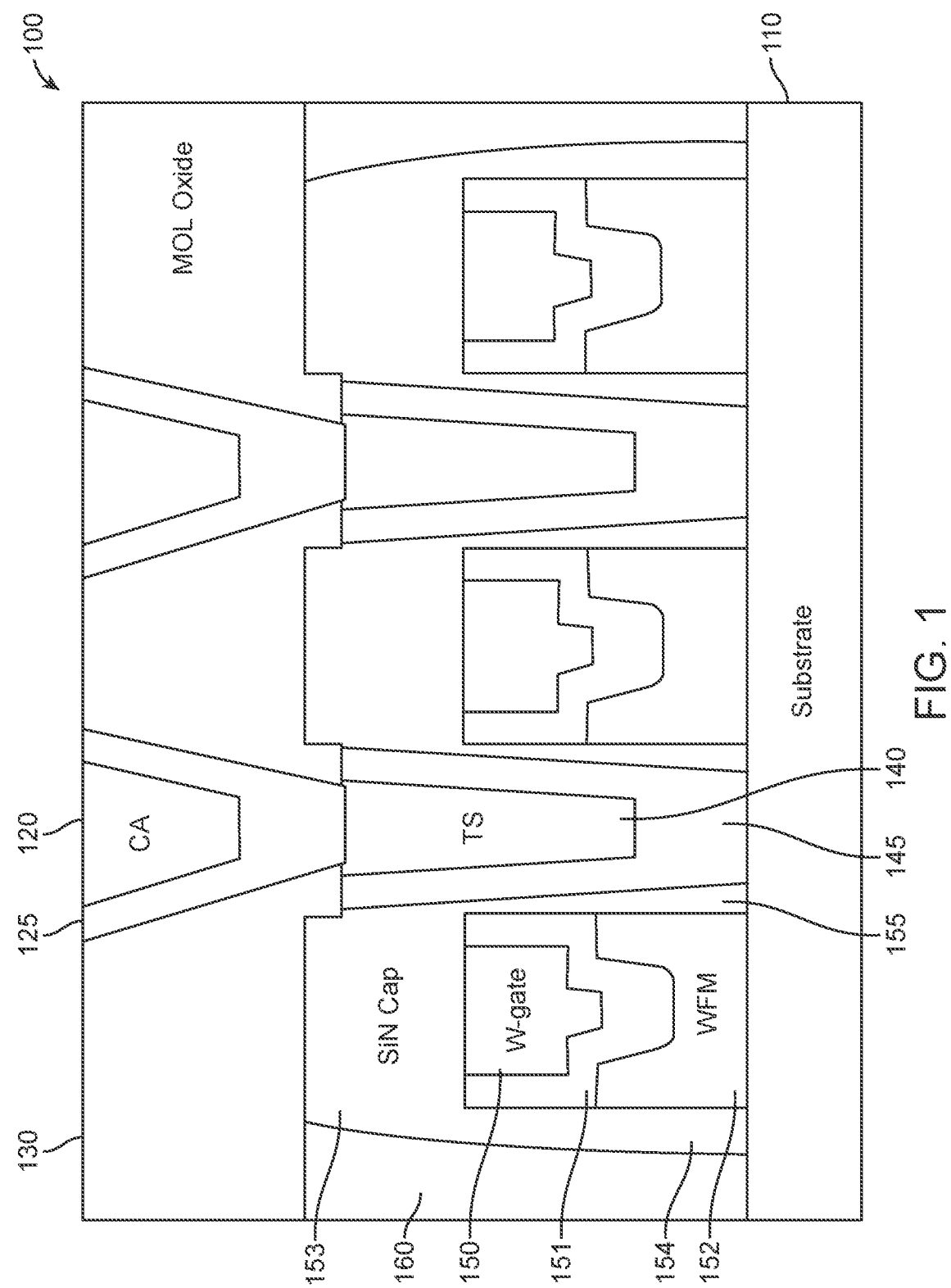
FIG. 1 is a cross-sectional view of an exemplary (nitride) structure formed on a substrate and shown after a conventional middle-of-line (MOL) process and W-contact chemical mechanical planarization/polishing (CMP)

FIG. 1 is a cross-sectional view of an exemplary (nitride) structure 100 formed on a substrate and shown after a conventional MOL process and W-contact chemical mechanical planarization (CMP). As shown, the nitride structure 100 on a substrate 110 includes an MOL oxide layer 130 and a nitride cap layer 153 that are formed over a metal gate (MG) 150 and interlayer dielectric (ILD) 151 surrounding the metal gate. Spacer material 154 and 155 (e.g., low-k spacer material) is on opposite sides of the MG 150 stack. In one embodiment, a low-k spacer is a spacer having a dielectric constant less than the dielectric constant of silicon nitride at room temperature, e.g., 7.0 or less, and preferably about, e.g., 5.0. Some examples of low-k materials may include, but are not limited to, hydrogen silsesquioxane polymer (HSQ), methyl silsesquioxane polymer (MSQ), polyphenylene oligomer, methyl doped silica or SiOx(CH3)y, SiCxOyHy or SiOCH, organosilicate glass (SiCOH) and porous SiCOH, silicon oxide, boron nitride, silicon oxynitride, etc. Work function metal (WFM) 152 (e.g., TiN, TaN, TaAlN, etc.) is on the lower portion of the MG 150 stack. A silicide surrounded by nitride 145 is formed in the nitride structure 100 in trenches 140 (the silicide in the trenches 140 may be referred to as trench silicide (TS) hereinafter. The self-aligned contact areas (CA) 120 are formed in the MOL oxide layer 130 and surrounded by a nitride layer 125 (e.g., TiN, SiN, etc.).

In one embodiment, the substrate 110 may be a semiconductor-on-insulator (SOI) substrate (e.g., fully-depleted SOI, partially depleted SOI, etc.). In other embodiments, the substrate 100 may be a bulk Fin field effect transistor (FinFET), SOI FinFET, strained SOI (SSOI), SiGe on-insulator (SGOI), Nanowire, etc. In one embodiment, an insulator layer 160 may include exemplary dielectric materials that, for example include, silicon oxide, silicon nitride, silicon oxynitride, and sapphire.

In one embodiment, the gate dielectric of the MG 150 stack includes a high-k material having a dielectric constant greater than silicon oxide. Exemplary high-k materials include, but are not limited to, $HfO_2$, $ZrO_2$, $La_2O_3$, $Al_2O_3$, $TiO_2$, $SrTiO_3$, $LaAlO_3$, $Y_2O_3$, $HfOxNy$, $ZrOY'$ $La_2OxNy$, $Al_2OxNy$, $TiOxNy$, $SrTiOxNy$, $LaAlOxNy$, $Y_2OxNy$, $SiON$, $SiNx$, a silicate thereof, and an alloy thereof. Each value of x is independently from 0.5 to 3 and each value of y is independently from O to 2.

In one embodiment, the gate cavity formed with the multiple depositions, etc. to form the MG 150 stack may be filled with at least one conductive material, such as at least one metallic material and/or at least one doped semiconductor material. Examples of the conductive metal include, but are not limited to, Al, W, Cu, Pt, Ag, Au, Ru, Ir, Rh and Re, alloys of a conductive metal, e.g., Al—Cu, metal nitrides or carbides such as AN, TiN, TaN, TiC and TaC, silicides of a conductive metal, e.g., W silicide, and Pt silicide, and combinations thereof. The gate electrode of the MG 150 stack can be formed by depositing the conductive material utilizing a conventional deposition process such as, for example, atomic layer deposition (ALD), chemical vapor deposition (CVD), metalorganic chemical vapor deposition (MOCVD), molecular beam epitaxy (MBE), physical vapor deposition (PVD), sputtering, plating, evaporation, ion beam deposition, electron beam deposition, laser assisted deposition, and chemical solution deposition.

Figure 2:
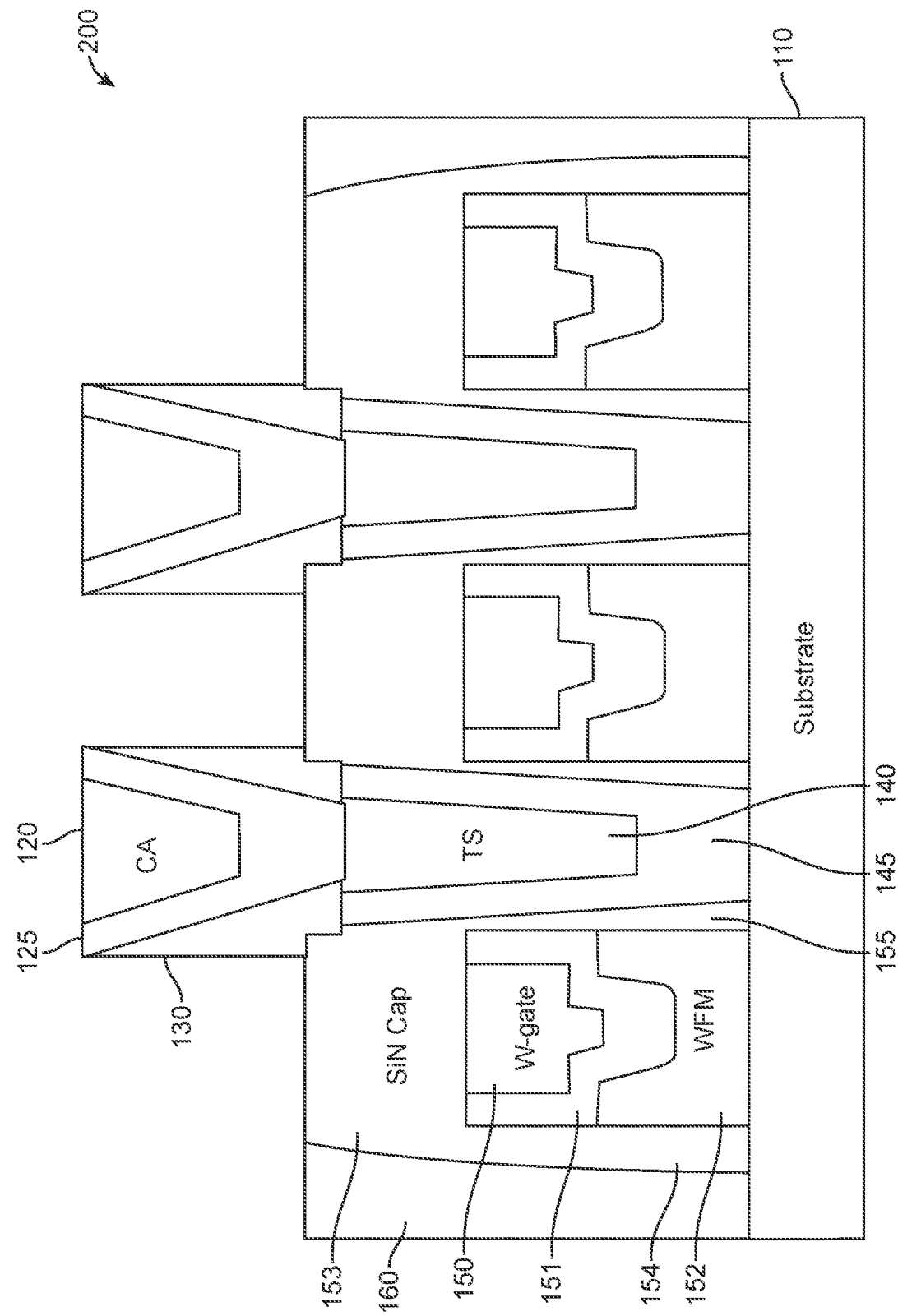
FIG. 2 is a cross-sectional view of a result of the exemplary structure of FIG. 1 after selective recess of an oxide layer, according to an embodiment.

FIG. 2 is a cross-sectional view of the result 200 of exemplary structure 100 after selective recess of the oxide layer 130, according to an embodiment. In one embodiment, the selective recess of the oxide layer 130 is selective to the CA 120 metal (e.g., W), nitride cap layer 153, (e.g., SiN) and nitride layer 125. In one embodiment, the recess may use dry etch, with or without block masking.

Figure 3:
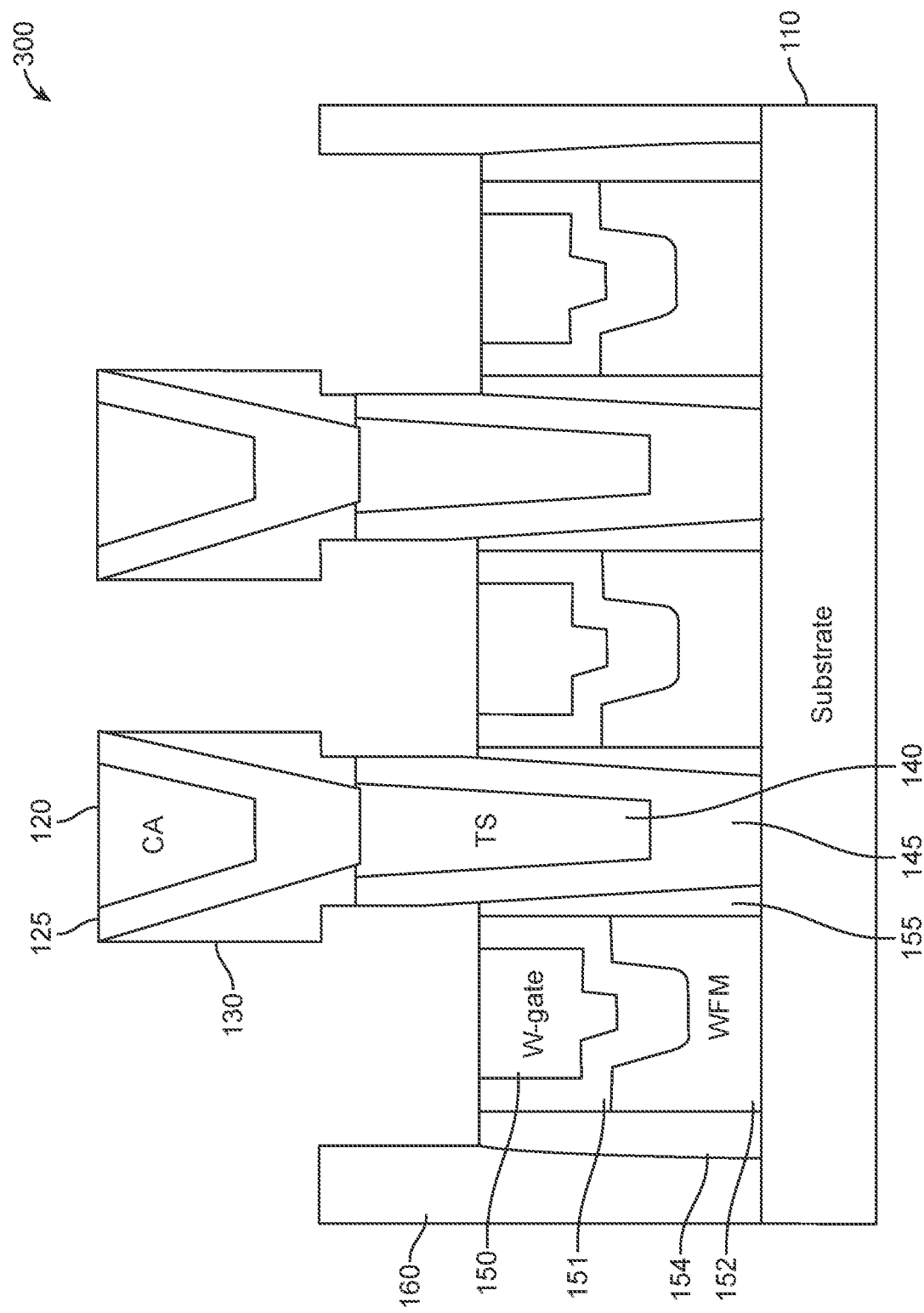
FIG. 3 is a cross-sectional view of a result of the exemplary structure of FIG. 2 after recess of the nitride to an oxide layer, according to an embodiment.

FIG. 3 is a cross-sectional view of the result 300 of exemplary structure 200 (FIG. 2) after selective recess of the nitride cap layer 153 to the remaining MOL oxide layer 130, according to an embodiment. Etching may be used for selective recessing the nitride cap layer 153.

Figure 4:
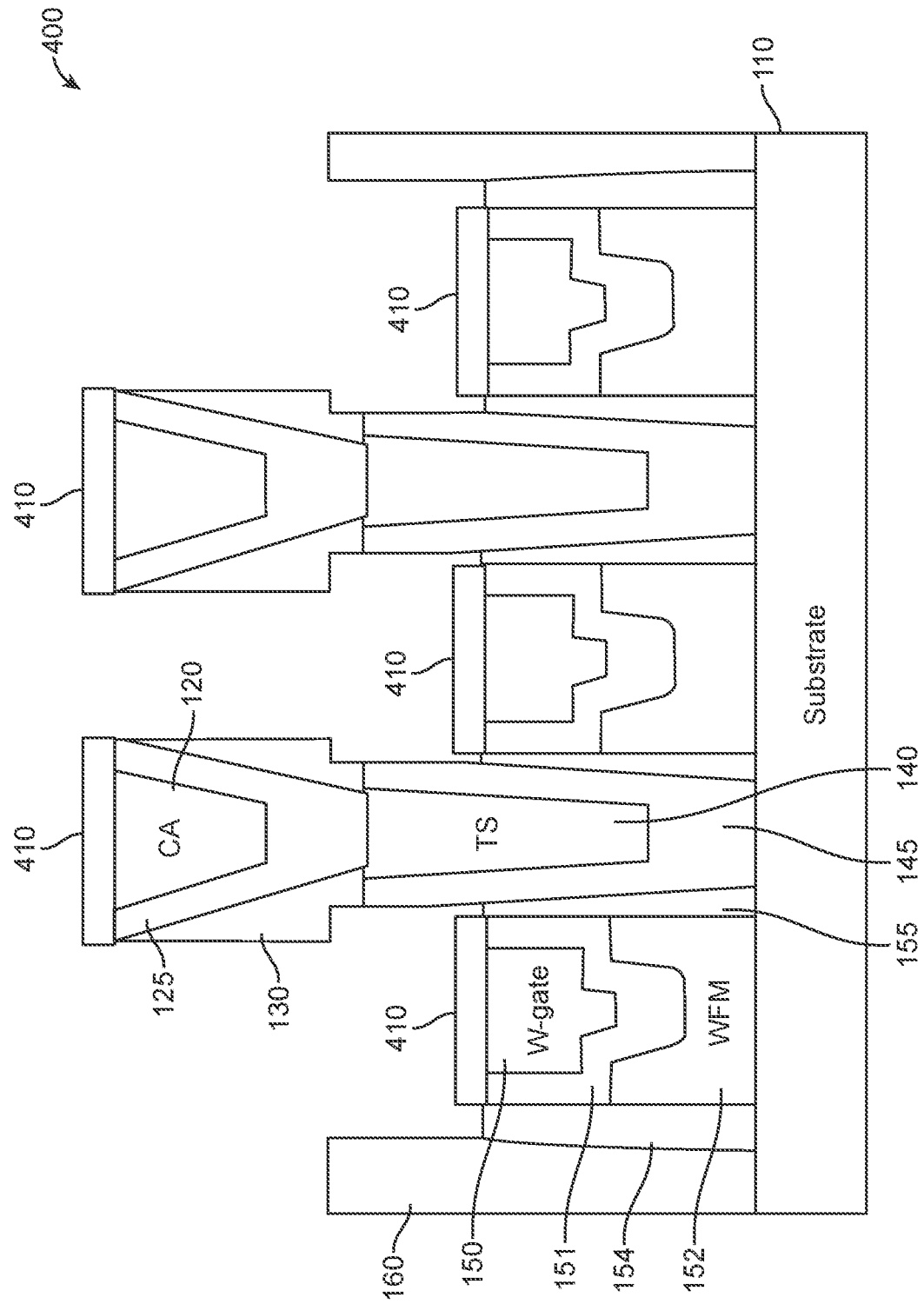
FIG. 4 is a cross-sectional view of the result of the exemplary structure of FIG. 3 after an optional selective metal cap deposition, according to an embodiment.

FIG. 4 is a cross-sectional view of the result 400 of exemplary structure 300 (FIG. 3) after an optional selective metal cap 410 deposition, according to an embodiment. In one embodiment, the metal cap may be cobalt (Co), ruthenium (Ru), etc. In one embodiment, the selective metal cap formation may be performed by CVD, an electroless process, etc. In one embodiment, the optional metal caps 410 may be formed on top of the MG 150 stacks, and on top of the CAs 120 as shown.

Figure 5:
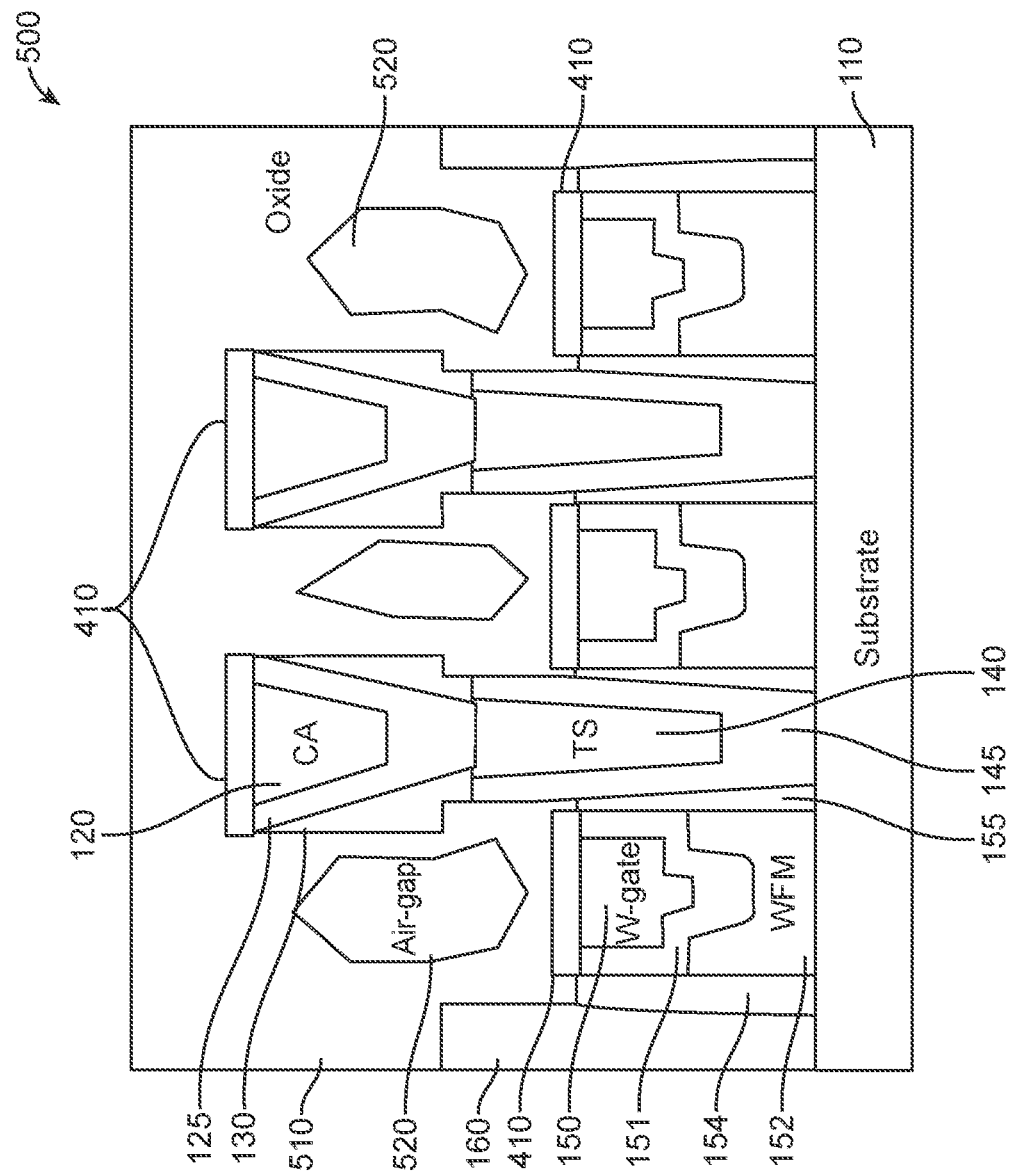
FIG. 5 is a cross-sectional view of the result of the exemplary structure of FIG. 4 after depositing oxide and introducing air-gap in fill, according to an embodiment.

FIG. 5 is a cross-sectional view of the result 500 of the exemplary structure 400 (FIG. 4) after depositing an air-gap oxide layer 510 and introducing air-gaps 520 in fill, according to an embodiment. In one embodiment, air-gaps are formed due to poor gap fill property of the oxide film deposited, artificially creating the void. In one embodiment, structures are regular, therefore the voids are controlled. In one embodiment, the introduction of the air-gaps reduces the capacitance of the MOL oxide layer 130 due to remaining MOL oxide layer 130 reduction, the air-gaps 520 and air-gap oxide layer 510.

Figure 6:
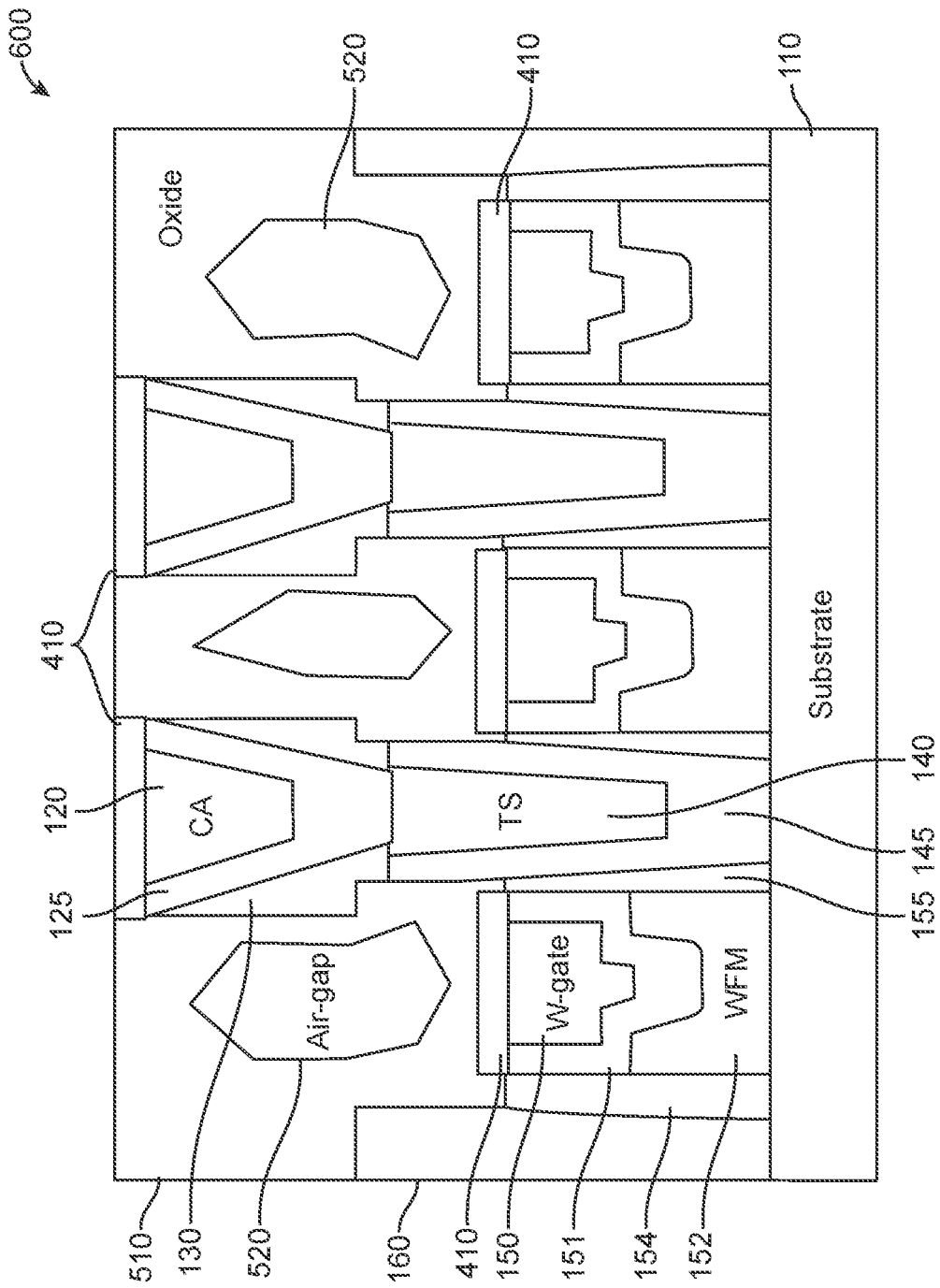
FIG. 6 is a cross-sectional view of the result of the exemplary structure of FIG. 5 after CMP is performed on the oxide (stop on metal), according to an embodiment.

FIG. 6 is a cross-sectional view of the resulting semiconductor device 600 of the exemplary structure 500 (FIG. 5) after CMP is performed on the air-gap oxide layer 510 (stop on metal), according to an embodiment. It should be noted that if metal cap 410 deposition is not employed, the CMP or other known techniques may be used to reduce the air-gap oxide layer 510 to the CAs 120 and nitride layer 125. In one embodiment, the resulting semiconductor device 600 is a semiconductor structure that may be employed in multiple different integrated circuit (IC) chips and products as described below.

In one embodiment, the resulting semiconductor device 600 may have a height above the substrate of about 8 nm to 260 nm. In one embodiment, the height of the MG 150 stack is about 50 nm to 150 nm, with a width of less than 30 nm. In one embodiment, the CAs 120 have a height of about 30 nm to 100 nm, and a width of less than 40 nm. In one embodiment, the metal caps 410 have a height of about 1 nm to 10 nm and a width less than 30 nm. In one embodiment, the spacer material 154 and 155 each have a height of about 50 nm to 150 nm and a width of less than 15 nm. In one embodiment, the air-gap oxide layer 510 has a height of about 30 nm to 100 nm. In one embodiment, the height of the air-gap oxide layer 510 from the metal cap 410 to about the remaining MOL oxide layer 130 or to the top of the insulator layer 160 is about 15 nm to 50 nm; and has a height of about 15-50 nm from above the top of the insulator layer 160 to the top of the air-gap oxide layer 510. In one embodiment, the height of the WFM 152 has a height of about 20 nm to 50 nm and a width of less than 30 nm. In one embodiment, the height of the MG 150 is about 30 nm to 199 nm and the width is less than 30 nm.

Figure 7A:
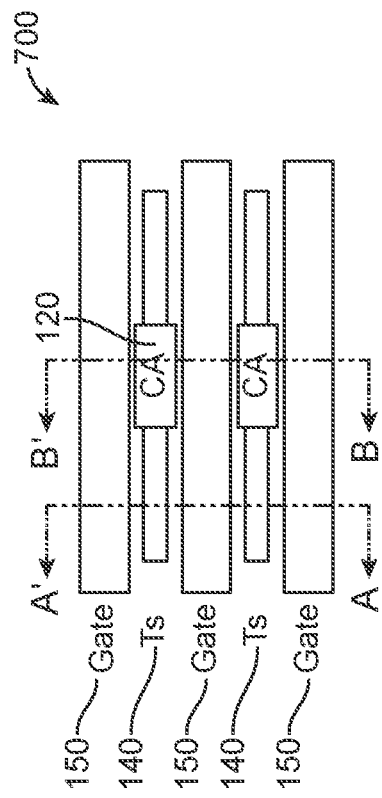
FIG. 7A is a top-down view of an exemplary semiconductor device (nitride) structure formed on a substrate and shown after a conventional MOL process and W-contact CMP.
Figure 7C:
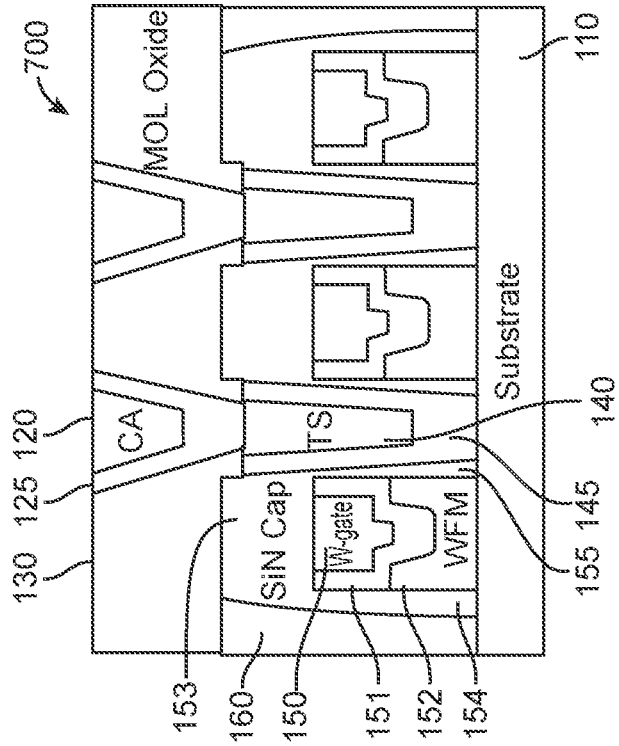
FIG. 7C is a cross-sectional view of the semiconductor device in FIG. 7A along section line B-B'.
Figure 7B:
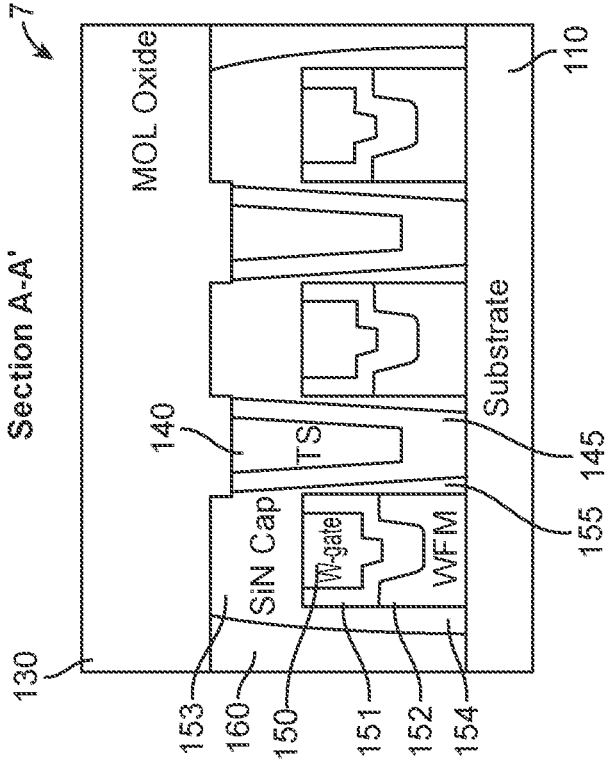
FIG. 7B is a cross-sectional view of the semiconductor device in FIG. 7A along section line A-A'.

FIG. 7A is a top-down view of an exemplary semiconductor device structure 700 formed on a substrate 110 and shown after a conventional MOL process and W-contact CMP. It should be noted that the exemplary semiconductor device 700 may be similar or equivalent to the exemplary (nitride) structure 100 (FIG. 1). FIG. 7B is a cross-sectional view of the semiconductor device 700 in FIG. 7A along section line A-A'. FIG. 7C is a cross-sectional view of the semiconductor device in FIG. 7A along section line B-B'.

Figure 8A:
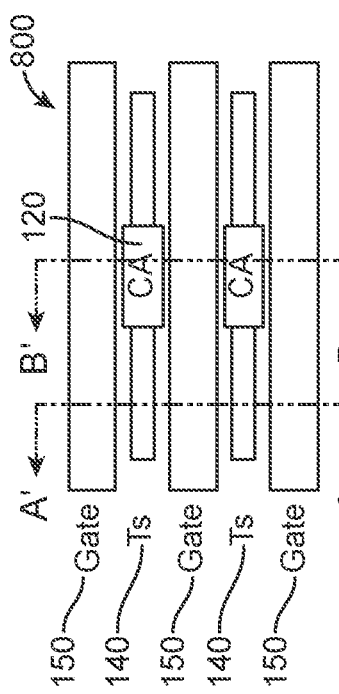
FIG. 8A is a top-down view of the semiconductor device structure formed on a substrate of FIG. 7A and shown after depositing a mask of the contact area (CA), according to an embodiment.
Figure 8C:
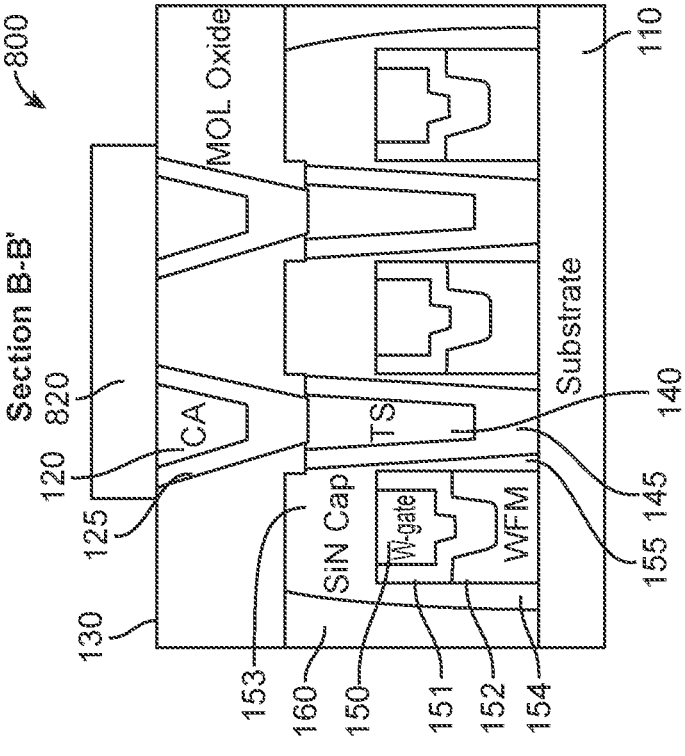
FIG. 8C is a cross-sectional view of the semiconductor device in FIG. 8A along section line B-B'.
Figure 8B:
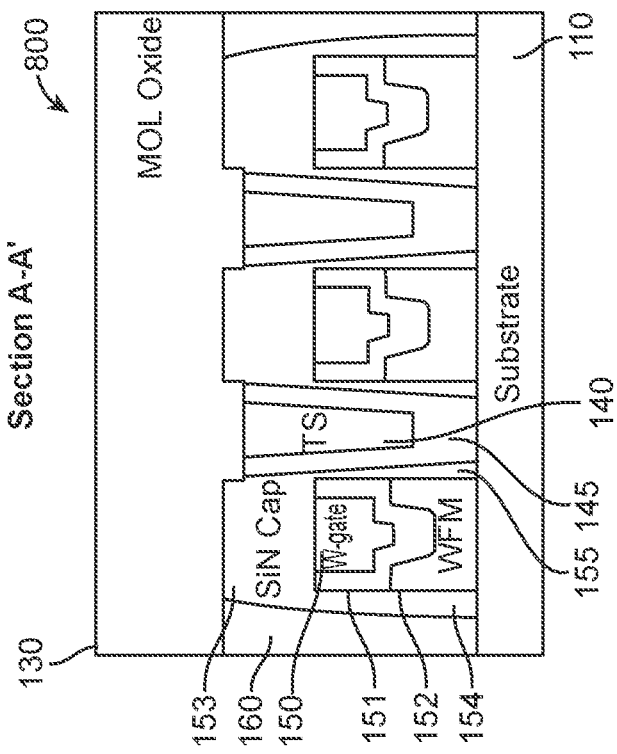
FIG. 8B is a cross-sectional view of the semiconductor device in FIG. 8A along section line A-A'.

FIG. 8A is a top-down view of the resulting exemplary semiconductor device 800 formed on a substrate 110 of FIG. 7A and shown after depositing a mask 820 on the CAs 120, according to an embodiment. In one embodiment, the mask may be applied using lithography or any other known technique. FIG. 8B is a cross-sectional view of the semiconductor device 800 in FIG. 8A along section line A-A'. FIG. 8C is a cross-sectional view of the semiconductor device 800 in FIG. 8A along section line B-B'.

Figure 9A:
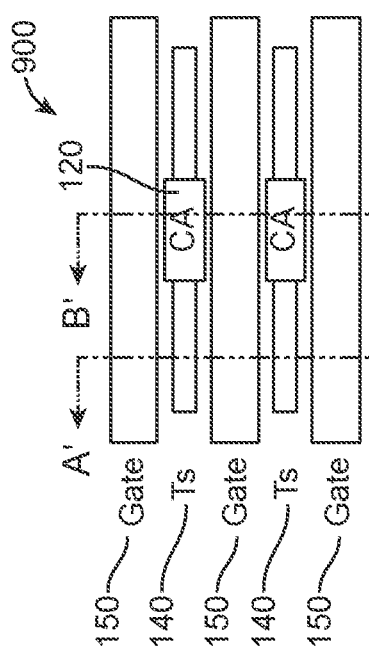
FIG. 9A is a top-down view of the exemplary semiconductor device structure of FIG. 8A and shown after selective recess of an oxide layer, according to an embodiment.
Figure 9C:
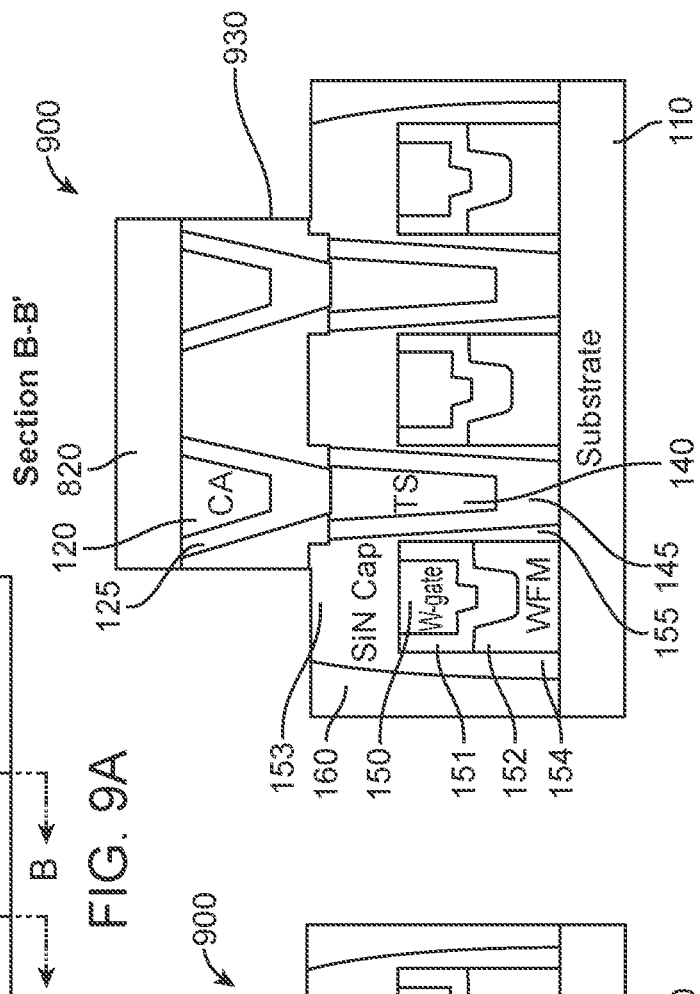
FIG. 9C is a cross-sectional view of the semiconductor device in FIG. 9A along section line B-B'.
Figure 9B:
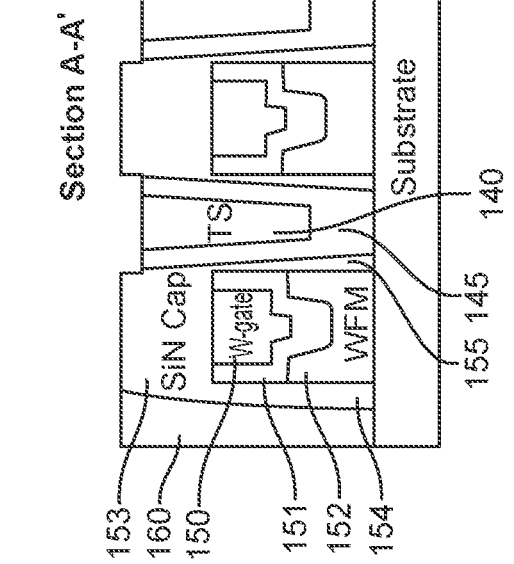
FIG. 9B is a cross-sectional view of the semiconductor device in FIG. 9A along section line A-A'.

FIG. 9A is a top-down view of the resulting exemplary semiconductor device 900 formed on the substrate 110 of FIG. 8A and shown after selective recess of the MOL oxide layer 130, according to an embodiment. FIG. 9B is a cross-sectional view of the semiconductor device 900 in FIG. 9A along section line A-A'. FIG. 9C is a cross-sectional view of the semiconductor device 900 in FIG. 9A along section line B-B'. As shown, the remaining MOL oxide layer 930 is reduced and the selective recess of the MOL oxide layer 130 is selective to the nitride (e.g., SiN) cap layer 153.

Figure 10A:
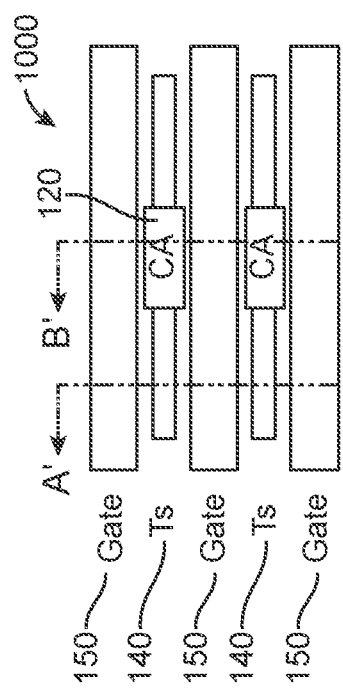
FIG. 10A is a top-down view of the exemplary semiconductor device structure of FIG. 9A and shown after recess of W/TiN, according to an embodiment.
Figure 10C:
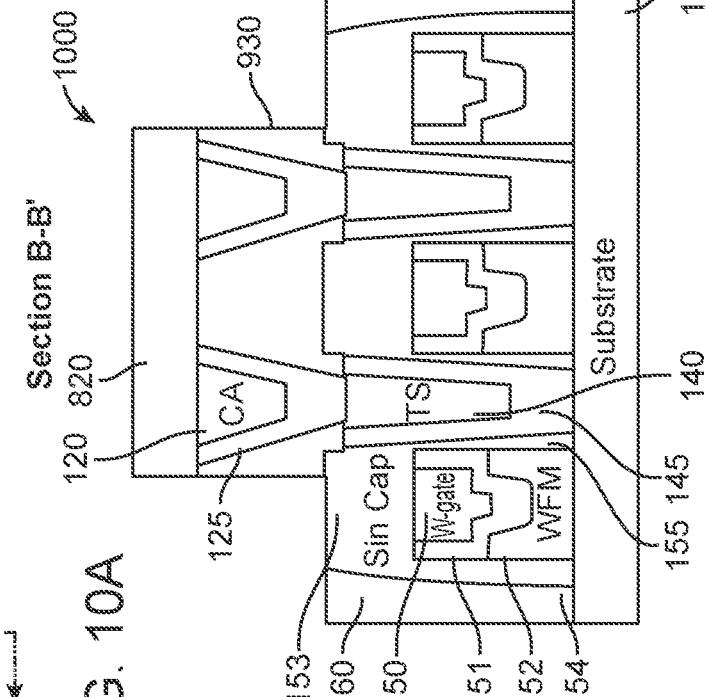
FIG. 10C is a cross-sectional view of the semiconductor device in FIG. 10A along section line B-B'.
Figure 10B:
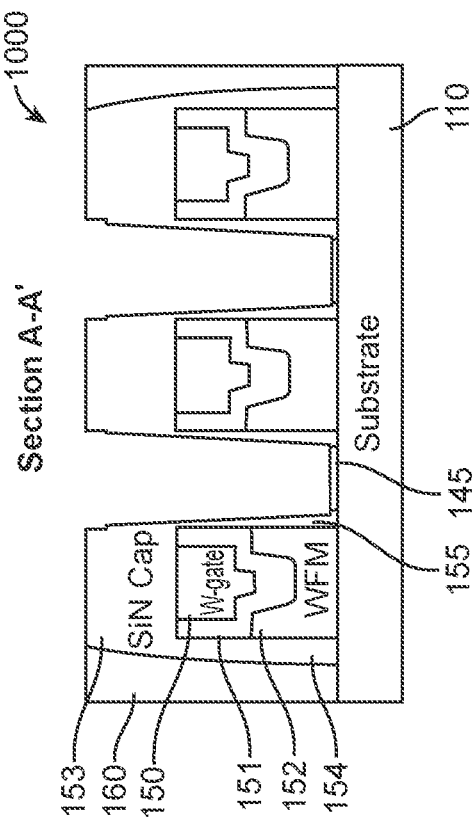
FIG. 10B is a cross-sectional view of the semiconductor device in FIG. 10A along section line A-A'.

FIG. 10A is a top-down view of the resulting exemplary semiconductor device 1000 formed on the substrate 110 of FIG. 9A and shown after recess of W/TiN, according to an embodiment. In one embodiment, etching is used to recess the W/TiN of the semiconductor device 1000. FIG. 10B is a cross-sectional view of the semiconductor device 1000 in FIG. 10A along section line A-A'. FIG. 10C is a cross-sectional view of the semiconductor device in FIG. 10A along section line B-B'.

FIG. 11A is a top-down view of the resulting exemplary semiconductor device 1100 formed on the substrate 110 of FIG. 10A and shown after etching of the nitride cap 125, according to an embodiment. In one embodiment, the nitride cap 125 (e.g., Sin Cap) is etched using reactive ion etching (RIE). FIG. 11B is a cross-sectional view of the semiconductor device 1100 in FIG. 11A along section line A-A'. FIG. 11C is a cross-sectional view of the semiconductor 1100 device in FIG. 11A along section line B-B'.

Figure 12A:
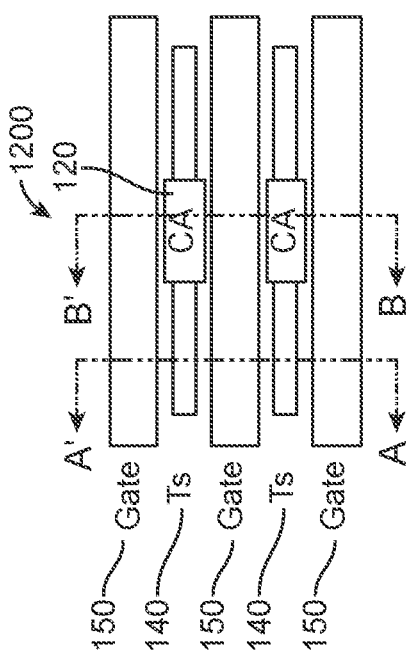
FIG. 12A is a top-down view of the exemplary semiconductor device structure of FIG. 11A and shown after an optional metal cap deposition, according to an embodiment.
Figure 12C:
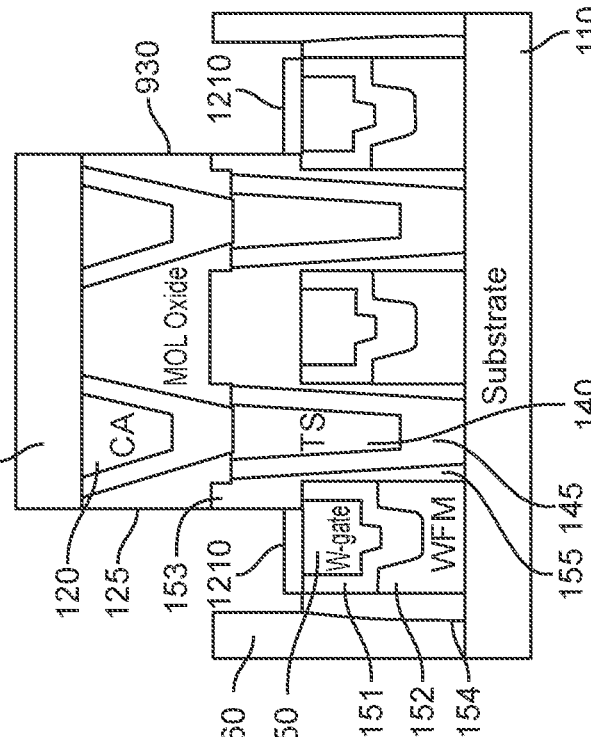
FIG. 12C is a cross-sectional view of the semiconductor device in FIG. 12A along section line B-B'.
Figure 12B:
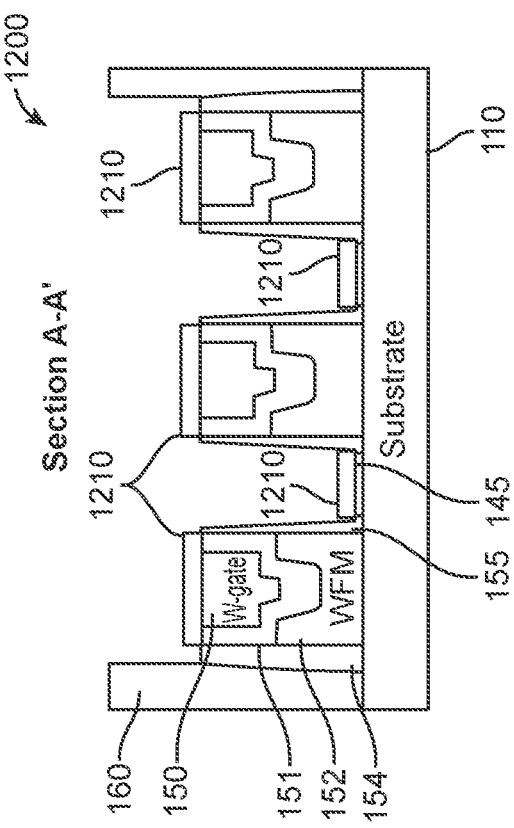
FIG. 12B is a cross-sectional view of the semiconductor device in FIG. 12A along section line A-A'.

FIG. 12A is a top-down view of resulting exemplary semiconductor device 1200 formed on the substrate 110 of FIG. 11A and shown after an optional metal cap 1210 deposition, according to an embodiment. In one embodiment, Co or Ru may be used for the metal caps 1210. In one embodiment, known deposition techniques may be used for the metal deposition. FIG. 12B is a cross-sectional view of the semiconductor device in FIG. 12A along section line A-A'. FIG. 12C is a cross-sectional view of the semiconductor device in FIG. 12A along section line B-B'.

FIG. 13A is a top-down view of the resulting exemplary semiconductor device 1300 formed on the substrate 110 of FIG. 12A and shown after removing the CA 120 mask 820 and oxide fill forming air-gaps 1320, according to an embodiment. In one embodiment, the air-gaps 1210 are formed due to poor gap fill property of the oxide film 1310 deposited, artificially creating the void. In one embodiment, structures are regular, therefore the voids are controlled. In one embodiment, the introduction of the air-gaps 1320 reduces the capacitance of the MOL oxide layer 130 due to remaining MOL oxide layer 930 reduction, the air-gaps 1320 and air-gap oxide layer 1310. FIG. 13B is a cross-sectional view of the semiconductor device in FIG. 13A along section line A-A'. FIG. 13C is a cross-sectional view of the semiconductor device in FIG. 13A along section line B-B'.

Figure 14A:
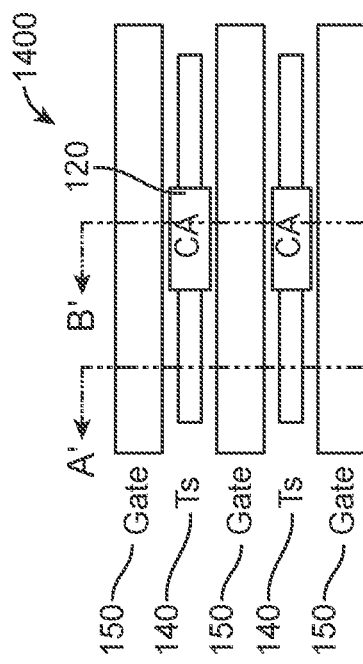
FIG. 14A is a top-down view of the exemplary semiconductor device structure of FIG. 13A and shown after oxide CMP stop on metals, according to an embodiment.
Figure 14C:
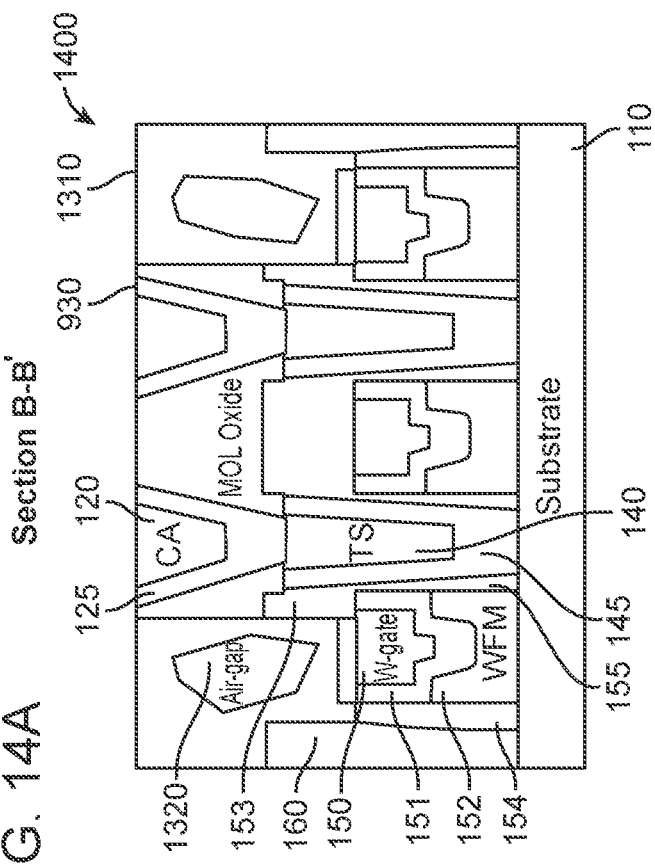
FIG. 14C is a cross-sectional view of the semiconductor device in FIG. 14A along section line B-B'.
Figure 14B:
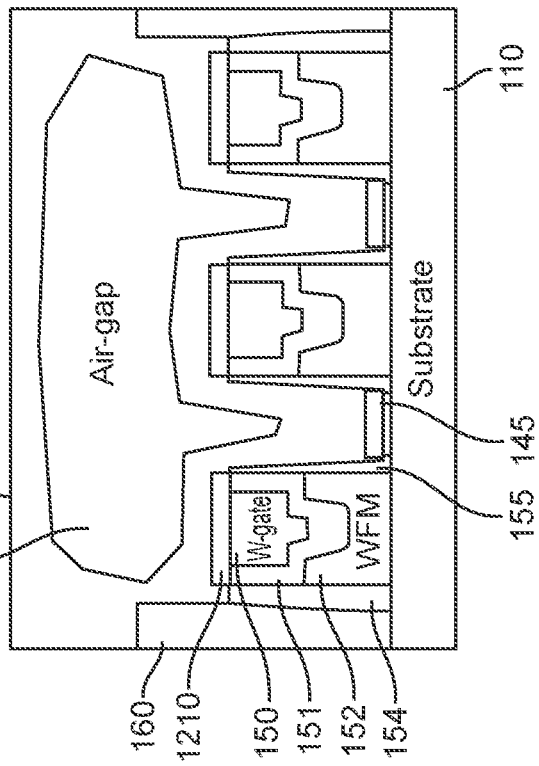
FIG. 14B is a cross-sectional view of the semiconductor device in FIG. 14A along section line A-A'.

FIG. 14A is a top-down view of the resulting exemplary semiconductor device 1400 formed on the substrate 110 of FIG. 13A and shown after oxide layer 1310 CMP stop on metals 1210, according to an embodiment. FIG. 14B is a cross-sectional view of the semiconductor device in FIG. 14A along section line A-A'. FIG. 14C is a cross-sectional view of the semiconductor device in FIG. 14A along section line B-B'. In one embodiment, the resulting semiconductor device 1400 is a semiconductor structure that may be employed in multiple different IC chips and products as described below. In one embodiment, the resulting exemplary semiconductor device 1400 has similar dimensions as described above for the resulting semiconductor device 600.

Figure 15:
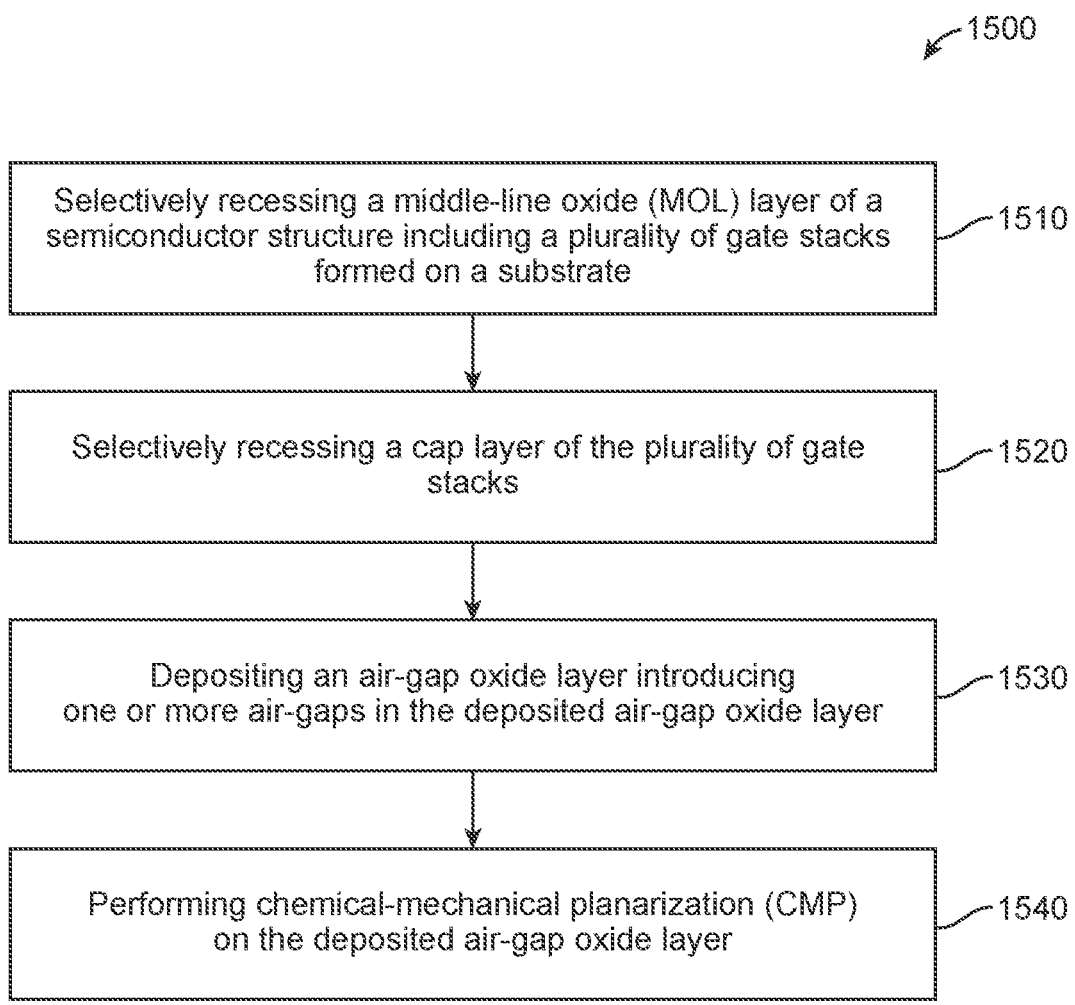
FIG. 15 illustrates a block diagram for a process for forming a semiconductor structure, according to one embodiment.

FIG. 15 illustrates a block diagram for a process 1500 for forming a semiconductor structure, according to one embodiment. In one embodiment, in block 1510 process 1500 selectively recesses an MOL oxide layer (e.g., MOL oxide layer 130, FIGS. 1 and 7A-C) of the semiconductor structure (e.g., exemplary (nitride) structure 100, FIG. 1, semiconductor structure 700, FIGS. 7A-C) including a plurality of gate stacks formed on a substrate. In block 1520 a cap layer (e.g., nitride cap layer 125, FIG. 1, nitride cap layer 153, FIG. 7B-C) of the plurality of gate stacks. In block 1530 an air-gap oxide layer (e.g., air-gap oxide layer 510, FIG. 5, air-gap oxide layer 1310, FIGS. 13B-C) is deposited introducing one or more air-gaps (e.g., air-gaps 520, FIG. 5, air-gaps 1320, FIGS. 13B-C) in the deposited air-gap oxide layer. In block 1540 CMP is performed on the deposited air-gap oxide layer.

In one embodiment, process 1500 may further include depositing metal caps (e.g., metal caps 410, FIG. 4, metal caps 1210, FIGS. 12B-C) to one or more CA elements (e.g., CAs 120, FIG. 1) and W gate elements (e.g., MG 150, FIG. 4 and FIGS. 13B-C), prior to depositing the air-gap oxide layer. In one embodiment, CMP on the deposited air-gap oxide layer stops on the metal caps. In one embodiment, process 1500 may further include masking CA elements of the semiconductor structure prior to selectively recessing the MOL oxide layer. In one embodiment, process 1500 may further include recessing W and TiN after selectively recessing the MOL oxide layer. In one embodiment, selectively recessing the cap layer of the multiple gate stacks includes etching the cap layer using RIE.

In one embodiment, process 1500 may further include removing the mask from the CA elements and then performing the depositing of the air-gap oxide layer. In one embodiment, the one or more air-gaps reduces capacitance of the MOL oxide layer.

The exemplary methods and techniques described herein may be used in the fabrication of IC chips. In one embodiment, the IC chips may be distributed by a fabricator in raw wafer form (i.e., as a single wafer that has multiple unpackaged IC chips), as a bare die, or in a packaged form. In the latter case, the IC chip is mounted in a single IC chip package (e.g., a plastic carrier with leads that are affixed to a motherboard or other higher level carrier) or in a multi-IC chip package (e.g., a ceramic carrier that has either or both surface interconnections or buried interconnections). The IC chip is then integrated with other IC chips, discrete circuit elements and/or other signal processing devices as part of either (a) an intermediate product, such as a motherboard, or (b) an end product, such as microprocessors, smart phones, mobile phones, cellular handsets, set-top boxes, DVD recorders and players, automotive navigation, printers and peripherals, networking and telecom equipment, gaming systems, toys and digital cameras, as non-limiting examples. One or more embodiments, may be applied in any of various highly integrated semiconductor devices.

Unless described otherwise or in addition to that described herein, "depositing" may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, PVD, ALD, chemical oxidation, MBE, plating or evaporation. Any references to "poly" or "poly silicon" should be understood to refer to polycrystalline silicon.

References herein to terms such as "vertical", "horizontal," etc. are made by way of example, and not by way of limitation, to establish a frame of reference. The term "horizontal" as used herein is defined as a plane parallel to the conventional plane or surface of the substrate, regardless of the actual spatial orientation of the semiconductor substrate. The term "vertical" refers to a direction perpendicular to the horizontal, as just defined. Terms, such as "on," "above," "below," "side" (as in "sidewall"), "higher," "lower," "over," "beneath" and "under," are defined with respect to the horizontal plane. It is understood that various other frames of reference may be employed for describing one or more embodiments without departing from the spirit and scope of the one or more embodiments.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of 35 U.S.C. section 112, sixth paragraph, unless the element is expressly recited using the phrase "means for" or "step for."

The terminology used herein is for the purpose of describing particular embodiments only and is not intended to be limiting of the embodiments. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, materials, and/or components, but do not preclude the presence or addition of one or more other features, steps, operations, elements, materials, components, and/or groups thereof.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the various embodiments with various modifications as are suited to the particular use contemplated.

What is claimed is:

1. A method of forming a semiconductor structure comprising:
   forming a first middle-of-line (MOL) oxide layer and a second MOL oxide layer in the semiconductor structure, the first MOL oxide layer including a plurality of gate stacks formed on a substrate, and each gate stack of the plurality of gate stacks including a source/drain junction;
   forming a first nitride layer over a silicide in the first MOL oxide layer;
   forming a second nitride layer;
   forming trenches through the second nitride layer down to the source/drain junctions;
   selectively recessing a nitride cap of the plurality of gate stacks;
   forming at least one self-aligned contact area (CA) element within the first nitride layer;
   selectively recessing the first MOL oxide layer on a first side and a second side of the at least one self-aligned CA element such that portions of the first MOL oxide layer remain on (i) top portions of the first nitride layer, (ii) portions of the silicide and (iii) portions of the nitride cap;
   depositing an air-gap oxide layer introducing one or more air-gaps in the air-gap oxide layer; and
   reducing the air-gap oxide layer to the at least one self-aligned CA element and the first nitride layer, wherein a portion of the air-gap oxide layer replaces a removed portion of the first MOL oxide layer.

2. The method of claim 1, wherein reducing the air-gap oxide layer comprises performing chemical-mechanical planarization (CMP) on the air-gap oxide layer.

3. The method of claim 2, further comprising:
depositing metal caps to the at least one self-aligned CA element and at least one gate element, wherein the at least one gate element comprises a tungsten (W) gate element.

4. The method of claim 2, further comprising:
masking the at least one self-aligned CA element of the semiconductor structure with a mask prior to selectively recessing the first MOL oxide layer.

5. The method of claim 4, wherein selectively recessing the nitride cap of the plurality of gate stacks comprises removing a portion of the nitride cap from a top of each of the plurality of gate stacks.

6. The method of claim 5, wherein selectively recessing the nitride cap of the plurality of gate stacks comprises etching the nitride cap using reactive ion etching (RIE).

7. The method of claim 5, further comprising:
removing the mask from the at least one self-aligned CA element and then performing the depositing of the air-gap oxide layer;
wherein each gate stack of the plurality of gate stacks include work function metal disposed between an interlayer dielectric and a substrate.

8. The method of claim 1, wherein the one or more air-gaps in combination with the selective recessing of the first MOL oxide layer and the air-gap oxide layer reduces capacitance of the first MOL oxide layer.

9. A method comprising:
forming a first middle-of-line (MOL) oxide layer and a second MOL layer in a semiconductor structure, the first MOL oxide layer including a plurality of gate stacks formed on a substrate, and each gate stack of the plurality of gate stacks including a source/drain junction;
forming a first nitride layer over a first silicide in the first MOL oxide layer;
forming a second nitride layer over a second silicide in the first MOL oxide layer;
forming trenches through the second nitride layer down to the source/drain junctions;
selectively recessing a nitride cap on each of the plurality of gate stacks;
forming a first self-aligned contact area (CA) element within the first nitride layer and a second self-aligned CA element within the second nitride layer;
masking the first and the second self-aligned CA elements with a mask; and
selectively recessing the first MOL oxide layer on a first side and a second side of each of the first and the second self-aligned CA elements such that portions of the first MOL oxide layer remain on (i) top portions of the first nitride layer, (ii) portions of the first silicide and (iii) portions of the nitride caps.

10. The method of claim 9, further comprising:
etching the nitride cap of each gate stack of the plurality of gate stacks;
removing the mask from the first and second self-aligned CA elements; and
depositing an air-gap oxide layer introducing one or more air-gaps in the air-gap oxide layer.

11. The method of claim 10, further comprising:
reducing the air-gap oxide layer to the first and the second self-aligned CA elements and the first and the second nitride layers.

12. The method of claim 11, wherein:
the nitride cap of each of the gate stacks of the plurality of gate stacks is formed over a metal gate of each of the gate stacks of the plurality of gate stacks and interlayer dielectric surrounding the metal gate;
the first silicide is surrounded by the first nitride layer;
the first silicide is formed in a first trench;
the second silicide is surrounded by the second nitride layer; and
the second nitride layer is formed in a second trench.

13. The method of claim 12, wherein:
the first trench is disposed between a first pair of adjacent gate stacks of the plurality of gate stacks; and
the second trench is disposed between a second pair of adjacent gate stacks of the plurality of gate stacks.

14. The method of claim 13, wherein reducing the air-gap oxide layer comprises performing chemical-mechanical planarization (CMP) on the air-gap oxide layer.

15. The method of claim 14, further comprising:
depositing metal caps to the first and second self-aligned CA elements and the plurality of gate stacks.

16. The method of claim 15, wherein metal of the metal gates of the plurality of gate stacks comprises tungsten (W) and each gate stack of the plurality of gate stacks include work function metal disposed between the interlayer dielectric and a substrate.

17. The method of claim 11, wherein etching the nitride cap of each gate stack of the plurality of gate stacks comprises etching using reactive ion etching (RIE).

18. The method of claim 11, wherein the one or more air-gaps in combination with the selective recessing of the first MOL oxide layer and the air-gap oxide layer reduces capacitance of the first MOL oxide layer.

* * * * *